United States Patent [19]

Suzki et al.

[11] 4,165,149
[45] Aug. 21, 1979

[54] DEVICE FOR SCANNING AN OBJECT WITH A LIGHT BEAM

[75] Inventors: Akiyoshi Suzki, Tokyo; Yoichi Hirabayashi, Machida, both of Japan

[73] Assignee: Canon Kabushiki Kaisha, Tokyo, Japan

[21] Appl. No.: 870,081

[22] Filed: Jan. 17, 1978

[30] Foreign Application Priority Data

Jan. 21, 1977 [JP] Japan .................................. 52/5503

[51] Int. Cl.$^2$ ...................... G02B 27/17; G02B 11/27
[52] U.S. Cl. ....................................... 350/6.1; 356/400
[58] Field of Search ............................. 350/6.1–6.91, 350/17; 250/236; 356/210, 172

[56] References Cited
U.S. PATENT DOCUMENTS

| | | | |
|---|---|---|---|
| 3,016,464 | 1/1962 | Bailey | 350/6.1 |
| 3,943,359 | 3/1976 | Matsumoto et al. | 356/172 |

*Primary Examiner*—Jon W. Henry

*Attorney, Agent, or Firm*—Fitzpatrick, Cella, Harper & Scinto

[57] ABSTRACT

Disclosed in this specification is a scanning device which scans an object having a flat reflection surface and an inclined reflection surface with an inclination relative to the flat reflection surface such as, for example, a mask and a wafer to be used in manufacturing IC, LSI, etc., with light beam, and detects only the reflected light from the inclined reflection surface with a light detector. In order to make it possible to detect only the reflected light from the inclined reflection surface with the light detector, a telecentric objective lens is used as the scanning lens in this scanning device, and the original point of deflection of the above-mentioned scanning light beam coincides with the center of the pupil of this telecentric objective lens. In addition, a filter is disposed on the pupil surface to intercept light from the flat reflection surface. An optical system between the scanning device and the object is of f-$\theta$ lens characteristics in order to compensate the non-linearity of the scanning beam caused by uniform angular velocity movement of the scanning device or the like.

3 Claims, 9 Drawing Figures

FIG. 5
FIG. 6
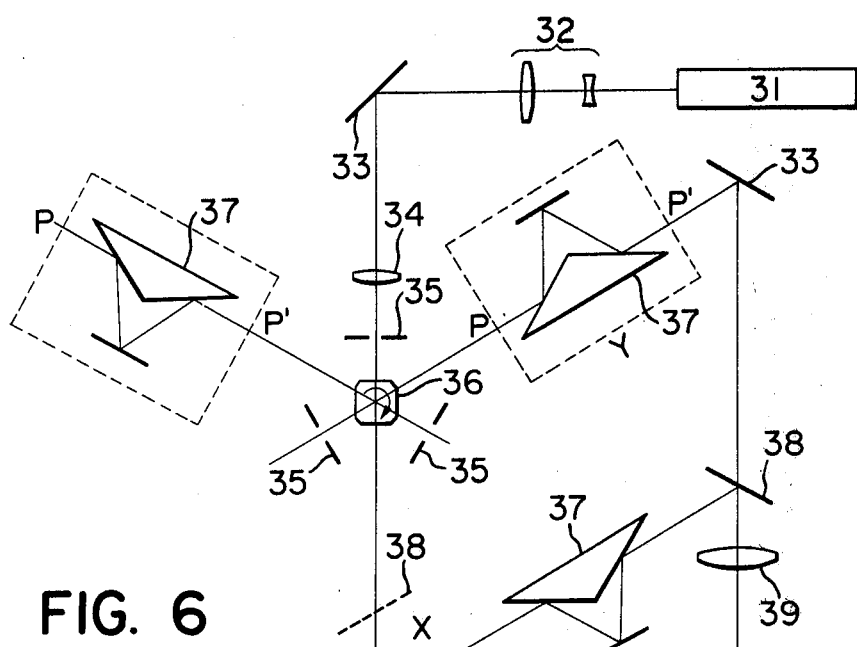
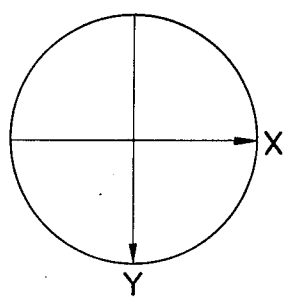
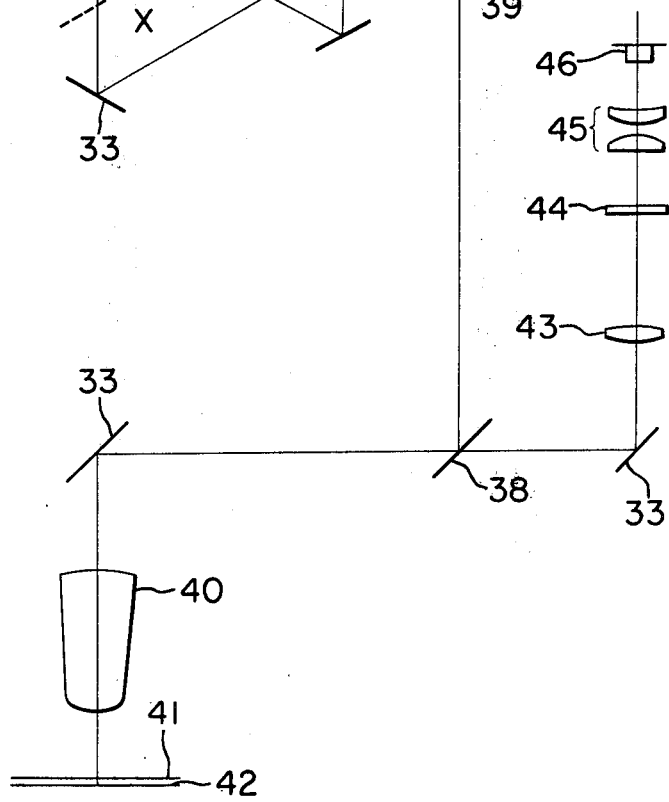

DEVICE FOR SCANNING AN OBJECT WITH A LIGHT BEAM

BACKGROUND OF THE INVENTION

1. Field of the Invention

This invention relates to a scanning device, and, more particularly, it is concerned with a scanning device which scans with light beam an object having a flat reflection surface and an inclined reflection surface with an inclination relative to the flat reflection surface, and detects with a light detector only the reflected light from the inclined reflection surface.

2. Description of the Prior Art

There are many kinds of objects having a flat reflection surface and an inclined reflection surface. In the present specification, explanation will be made of an alignment mark on a mask and a wafer for use in fabrication of IC and LSI, as a sample.

In general, alignment of the mask and wafer has so far been done by moving in parallel any one of the mask and the wafer relative to the other until the alignment marks on both of them come to a predetermined positional relationship. In order to carry out the appropriate alignment, the alignment marks provided on both mask and wafer must be observed.

For the method of observing this alignment mark, there have been known the so-called "bright field observation", in which reflected light from the flat reflection surface is observed, and the so-called "dark field observation", in which the reflected light from the inclined reflection surface is observed. The scanning device of the present invention is concerned with the latter method, i.e., dark field observation, about which more detailed explanations will be made hereinbelow.

A device for observing an object having both a flat surface and an inclined surface, such as the alignment mark of a wafer for IC pattern printing in a dark field, has already been proposed in U.S. application Ser. No. 672,022, filed Mar. 30, 1976, now U.S. Pat. No. 4,062,623 and having the same assignee-to-be as that of the present application. While the device in this earlier application will be explained in detail in reference to a drawing illustration at a later paragraph, it can be outlined as follows. An image of a light source for illuminating the surface of an object and which is smaller in size than the pupil of a telecentric objective lens is formed on the pupil plane of the lens, then the entire region of the object to be observed is illuminated, and the regular reflected light from the flat surface within the region to be observed is intercepted by a light intercepting plate of a size substantially corresponding to the image of the abovementioned light source disposed on the pupil surface of the telecentric objective lens or the image surface of the pupil, whereby an object image to be formed by a non-regular reflected light from the inclined surface within the abovementioned region to be observed and passing through the light intercepting plate (i.e. dark field image) is scanned.

In this specification, the term "telecentric objective lens" refers to a lens having such a property that the principal light ray becomes parallel with the optical axis, when the light source is disposed at an intersection of the optical axis of the lens and its pupil surface. By the term "flat surface", it is meant such surface that intersects orthogonally with the optical axis of the telecentric lens. Also, the term "inclined surface" means such surface that does not intersect orthogonally with the optical axis of the telecentric lens.

As is understandable from the above explanations, the invention as disclosed in the earlier application illuminates the entire region of the object to be observed, and sequentially detects lights from a part of the region, on account of which only a very small portion of the light amount for illuminating the object is used at the time of the light detection. Thus, it cannot be said that the illuminating light is utilized in an effective manner.

The copending U.S. application Ser. No. 790,072 filed Apr. 22, 1977, relates to improvement in the prior invention in the abovementioned earlier application, now U.S. Pat. No. 4,062,623 the point of improvement of which resides in utilizing this illuminating light to the object as effectively as possible. For this purpose, the device concerned adopts the so-called "flying spot light scanning system", in which the object surface is sequentially scanned with a relatively narrow scanning light beam, and the light reflected from this object surface is detected.

It should, however, be noted that the invention disclosed in U.S. Ser. No. 790,072 now U.S. Pat. No. 4,062,623 is not a simple application of the flying spot light scanning system to the device of the abovementioned earlier U.S. application Ser. No. 672,022, but intends to solve a problem which is liable to occur when this flying spot light scanning system is adapted to the device of the prior invention. This problem is derived from the fact that, when the scanning beam is projected into the telecentric objective lens, the position of the scanning beam crossing the pupil plane of this telecentric lens varies due to deflection or swerving of the scanning beam, on account of which the position of the scanning beam crossing the abovementioned pupil surface is varied, when the reflected light from the flat surface travels backward. As the result of this, there takes place such possibility that the reflected light from the flat surface (regular reflected light) becomes unable to be removed due to presence of the light intercepting member disposed on the pupil surface of the telecentric objective lens of the image surface of the pupil.

This problem is solved, according to the abovementioned invention, by making constant the position where the scanning beam crosses the pupil surface of the telecentric lens, i.e. by causing the original point of deflection of the scanning beam to coincide with the pupil plane of the telecentric lens.

The present invention further improves the improved device as mentioned above, in that the scanning beam is moved at a constant speed.

SUMMARY OF THE INVENTION

The object of the present invention is to provide a device wherein a surface to be scanned can be scanned by a scanning beam which moves at a constant speed, and wherein a light reflected by the surface to be scanned can be detected in a dark field. The object is attained by arranging between the deflector and the object an optical element for converting the movement of the scanning beam into a constant speed movement over the entire area, to be scanned, of the object.

The foregoing object and other object of the present invention will become more apparent and understandable from the following detailed description thereof, when read in conjunction with the accompanying drawing.

BRIEF DESCRIPTION OF THE DRAWINGS

In the drawing:

FIG. 5 is a schematic diagram showing an optical layout of a second embodiment of the present invention;

FIG. 6 shows a sight of a microscope in accordance with the second embodiment of the present invention shown in FIG. 5;

DETAILED DESCRIPTION OF THE PREFERRED EMBODIMENT

Figure 1:
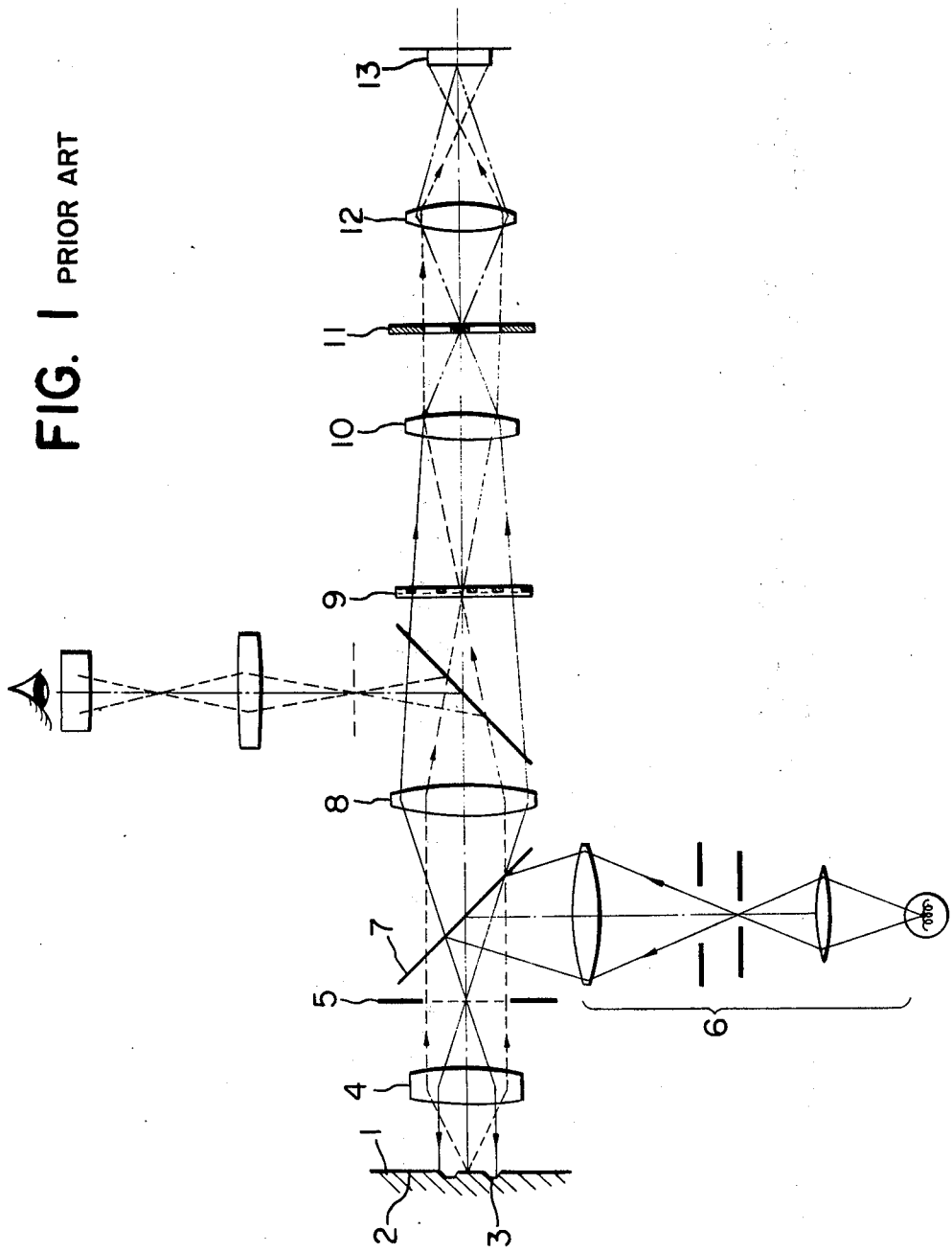
FIGS. 1 and 2 are respectively schematic diagrams of the light scanning device of a dark field type as disclosed in an earlier application.
Figure 2:
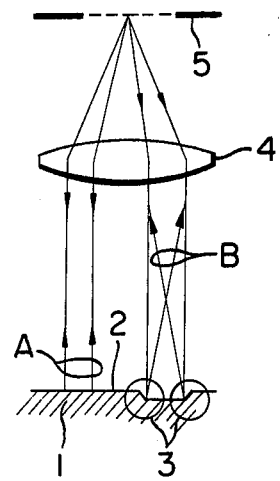

Referring first to FIG. 1, which shows the optical layout of the scanning light detecting device by the dark field method as proposed in the afore-mentioned earlier U.S. Patent application Ser. No. 672,022, a reference numeral 1 designates an object to be scanned. This object 1 to be scanned has a flat surface 2 and an inclined surface 3 having an inclination relative to this flat surface. A reference numeral 4 indicates a telecentric lens, and another reference numeral 5 designates an aperture disposed on the pupil field of the telecentric lens 4. A reference numeral 6 denotes an illuminating optical system to form a light source image in a size smaller than the pupil diameter of the telecentric objective lens on the pupil surface thereof through a half mirror 7. A numeral 8 refers to a relay lens, and 9 denotes a scanner having an open slit and disposed on the image surface of the object 1. A reference numeral 10 designates an image forming lens for the pupil 5, and 11 indicates a light intercepting plate having a ring-shaped opening disposed at an image position of the pupil of the telecentric objective lens 4. The light intercepting portion corresponds to the size of the light source image formed on the pupil of the telecentric lens 4. A reference numeral 12 designates a light converging lens, and 13 refers to a light detector. As stated in the preceding, since the telecentric objective lens 4 has such a property that the principal light ray of light beam becomes parallel with the optical axis of the lens, when the light source is disposed at the intersection of the optical axis and the pupil plane of the lens, the reflected light A (see FIG. 2) from this flat surface 2 is again converged on the position of the light source image, when the flat surface 2 is made perpendicular to the optical axis. However, as the light projected onto the inclined surface 3 is diverted its travelling direction, it does not return to the position of the light source image. Accordingly, the light from the light intercepting plate 11 consists solely of the reflected light B from the inclined surface 3 with the result that the light to be detected by the light detector 13 is only that from the inclined surface 3 of the object 1. This detection system will hereinafter be referred to as "dark field detection system".

The light scanning method as disclosed in the earlier U.S. application Ser. No. 672,022 forms an object image by illuminating the entire surface of the object 1, and the light from a part of the image is taken out sequentially by the scanner 9 to be led to the light detector. On account of this, the detection efficiency of the illuminating light is extremely low, so that a problem arises in respect of light amount.

The present invention, in place of scanning the image on the image surface, adopts a system of scanning an object with a light from the illuminating system by forming it on the object surface in the shape of a spot or a slit. According to this system, since the light which has heretofore been used in irradiating the overall surface of the object can be concentrated onto the position where a signal is to be taken out, remarkable increase in the detected light amount can be attained. Reduction in size of the spot can be realized by attaching a collimator lens of a long focal length to the illuminating light source to thereby converge light. In other way, a small-sized spot light can be readily obtained by the use of laser beam. For illuminating the object surface with moving light beam, it is necessary that the scanning beam be projected into the telecentric objective lens. In this case, however, the scanning beam moves even on the pupil of this objective lens. At this time, since the position of the reflected light A to be intercepted tends to move, along with the scanning operation on the object surface, even at a place of the light intercepting plate 11 which is the conjugative position of the pupil, separation of the reflected light B for detection becomes difficult.

The present invention has succeeded in removing such defect to take place with the direct scanning of the light beam on the object surface, and has, as its aim, the original point of deflection of the scanning beam at the intersection of the pupil plane and the optical axis of the objective lens, thereby causing the position of the beam on the pupil plane to be substantially unmovable, no matter how the scanning beam scans the object surface. This original point for deflection has a close relationship with the scanning system.

As the scanning means, there has been known a rotating parallel flat plate. A transmitting type rotatory polygonal mirror and vibrating type parallel flat plate of a photo-electric microscope are examples. In other words, this scanning means utilizes the parallel flat plate for light transmission, and, by causing this parallel flat plate to incline with respect to the optical axis, the light beam is shifted sidewise. In this case, the property of the parallel flat plate is such that it retains the parallelism, even when the incident light and the transmitting light have shifted sidewise. Accordingly, it can be understood that the light beam after its passage through the parallel flat plate is merely shifted sidewise in the optical axis direction with the angle thereof being unchanged. In this case, the aberration to occur due to the inclination is almost negligible in view of the fact that the F-number is ordinarily large and the field angle is small. In order that the positional discrepancy of the scanning beam on the pupil of the telecentric objective lens may be made substantially zero at the time of the scanning operation, in other word, in order to position the original point of deflection on the pupil of the telecentric objective lens, it may be sufficient that a relay lens is interposed between the parallel flat plate for scanning and the telecentric object lens, and the focal plane of the relay lens is coincided with the pupil plane of the telecentric objective lens. When the reference light path of the principal light ray of the beam to be scanned (i.e., center of the beam) is taken as the optical axis (that is, when the principal light ray is projected perpendicularly onto the parallel flat plate), the principal light ray of the beam remains to be parallel with it being shifted sidewise relative to the optical axis, as already explained in the foregoing, even if the parallel flat plate inclines for the scanning operation. This parallel principal light ray group to occur with the scanning operation passes through the focal point of the relay lens without failure after it has passed through the relay lens. In other words, the beam does not move on the pupil plane, even if the scanning operation is carried out.

For the scanning means, there has also been known a rotatory reflection mirror. Examples of such scanning means are a galvano mirror, a reflective type polygonal mirror, and the like. In this case, the angle of the principal light ray of the beam after it is emitted from the scanning means is in no way parallel as in the case of the transmission type, so that an entirely different method should be used for the beam not to be deflected on the pupil surface. For this purpose, there may be utilized such a principle that the light beam which is being projected onto the scanning means does not almost change its reflecting point on the scanning means. That is to say, the reflecting point on the scanning means and the center of the pupil plane of the telecentric objective lens can be brought to a mutually conjugative relationship through an image forming system. For this purpose, the relay lens and a field lens should appropriately be located between the scanning means and the objective lens. The reflecting point of the light beam on the polygonal mirror and reflective mirror may move more or less due to rotation of such mirror, although the deflection is so small that it does not raise any operational problem or inconvenience. Accordingly, the beam position on the pupil surface may be presumed to be almost unmovable along with the scanning operation.

In the following, the present invention will be explained in particular reference to the optical layout as shown in the accompanying drawing.

Figure 3:
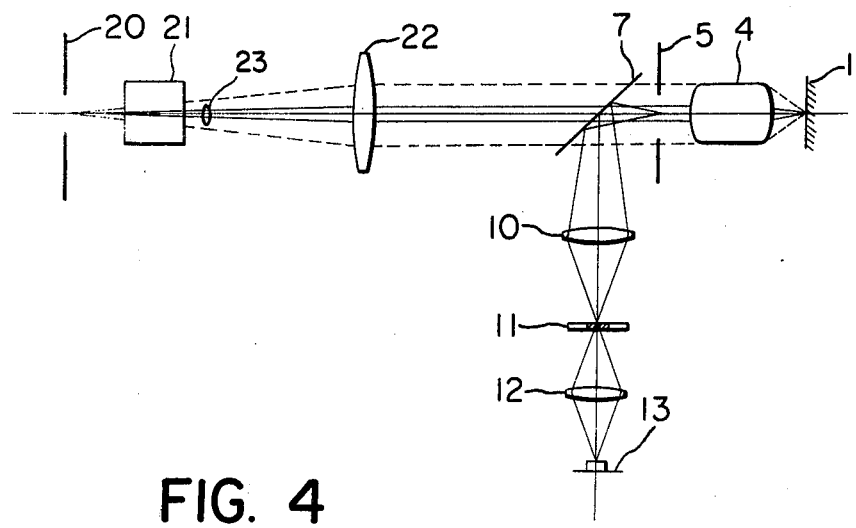
FIG. 3 is also a schematic diagram showing an optical layout of a first embodiment of the present invention.
Figure 4:
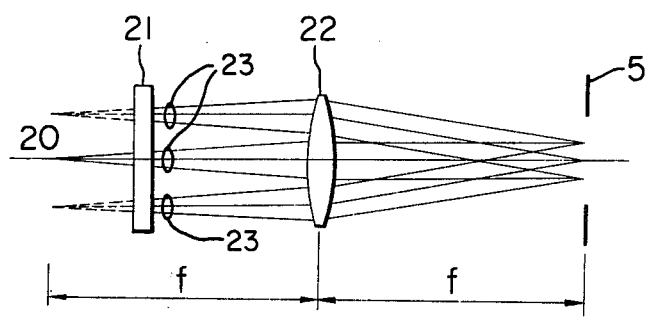
FIG. 4 is a schematic diagram of a main part of the optical system shown in FIG. 3 for the purpose of explanation.

Referring to FIG. 3, which indicates the first embodiment of the optical layout according to the present invention, a reference numeral 20 designates an opening in the form of a slit or spot which is disposed in the light beam from the light source, and which is in a conjugative relationship with an object 1. A reference numeral 21 designates a scanning system of a type which causes the light from the opening 20 to move parallelly such as, for example, a transmitting type scanning system consisting of a rotatable glass block as already mentioned. A relay lens 22 is so disposed that its rear side focal plane may coincide with the pupil 5 which constitutes the front side focal plane as well as the pupil plane of the telecentric objective lens 4. FIG. 4 briefly indicate the function of this lens. In this illustration, the opening 20 is coincided with the front side focal plane of the relay lens 22 for simplicity and clarity in explanations. The light beams 23 after they have passed through the scanning device 21 are merely shifted sidewise relative to each other on the principle that the incidence angle is equal to the transmitted angle, which is the property of the parallel planes. Accordingly, each beam corresponds to such a situation as if it were emitted from the focal plane of the relay lens 22, and it becomes a parallel light after its passage through the relay lens 22. Here, since the principal light ray which is the center of each beam is parallel with the optical axis after its emission from the scanning system 21, it passes through the center of the pupil 5 which is the rear side focal plane of the relay lens 22 as well as the front side focal plane of the objective lens 4, after its passage through the relay lens 22. The angle of the light passage depends upon the sidewise shifting of the principal light ray, although the light always passes through the center of the pupil 5 which is also the pupil surface of the objective lens 4. In this case, for the filtering operation as explained in FIG. 1 to be possibly carried out by the lens system consisting of the component members 10, 11, 12, and 13 as shown in FIG. 1, it is desirable that the F-number of the light beam 23 be made larger than the F-number of the relay lens. Then, as shown in FIG. 4, the diameter of the incident light beam which has arrived at the pupil plane in the form of a parallel light owing to the relay lens becomes smaller than the diameter of the pupil of the objective lens. Owing to the property of the telecentric objective lens, the pupil 5, after the light is reflected at the flat portion on the object surface 1, again focusses on the position of the pupil 5 with an equal magnification. Consequently, the light beam reflected at the flat portion on the object surface again passes through the position of the pupil 5 with an effective diameter smaller than the pupil diameter. That the principal light ray of the passing beam unchangeably passes through the center of the pupil 5, in spite of the scanning operation being conducted on the object surface, can be easily understood from the fact that the principal light ray is perpendicularly projected onto the objective with the telecentric object lens and is reflected to travel back along its original path. The light then enters the detection optical system by means of a beam splitter 7. The pupil 5 is focussed on the position of the light intercepting plate 11 by means of the lens 10. The manner, in which only the reflected light component from the flat portion formed at the location of the light intercepting plate 11 is removed by a stopper to take out only the light from the edge of the pattern, is exactly same as in the case of FIG. 1. Since the incident light beam forms a bright spot or a slit on the pupil 5, the filtering operation on the position of the light intercepting plate 11 which is conjugate with the pupil is easy. For instance, when the scanning beam is in the form of a spot, the shape of the light beam to be filtered is in a spot. Therefore, on the position of this light intercepting plate 11, there may be disposed a filter to intercept this spot-shaped light beam such as, for example, that having a transmitting portion in a ring shape. When the scanning beam is in the form of a slit, the diameter of the light beam on the pupil surface may sometimes assume a slit-shape. In this case, a filter having a slit-shaped light intercepting portion may be placed at the light intercepting plate 11. In like manner, the shape of the filter 11 can be arbitrarily varied depending on cases concerned.

FIG. 5 shows another optical layout of an embodiment, wherein the present invention is applied to an automatic aligner for an integrated circuit (IC). For a mask and a wafer to be two-dimensionally aligned by the use of this automatic aligner, at least two places (or points) should be observed. In this illustration, however, only one of them is shown. In other words, while another optical system for observation and detection is to be disposed on the left side portion of the drawing, it is omitted from showing, because it is exactly same as the right side portion as illustrated. It is to be noted that the scanner 36 is so constructed that it may be used commonly. It goes without saying, however, that the number of the scanners may be increased depending on the number of observing point.

In FIG. 5, a reference numeral 31 designates a light source. Considering directivity and brightness of the beam, as mentioned in the foregoing, use of laser is convenient, hence the light source 31 in this illustration is assumed to be the laser. Since the output light of the laser can be converted to a photo-electric signal with high efficiency, the laser of 1 mW or below will suffice the purpose of the present invention. A reference numeral 32 designates a beam expander which serves for expanding the laser beam. This component part may, of course, be dispensed with, when the beam diameter is not necessary to be expanded. A mirror 33 and a lens 34 function to focus the laser beam on a slit (or spot) 35. In this case, the lens 34 should preferably be a cylindrical lens, if 35 is in a flat form, while it is sufficient to be an ordinary spherical lens, if 35 is in a spot form. Also, the F-number of the lens is defined to maintain a relationship with the F-number of the relay lens as explained in regard to FIG. 4. Numeral 36 (FIG. 5) refers to a transmission type scanner which is made of a glass block. Incidentally, it should be understood that the rotational axis of this scanner passes through an intersecting point of the three optical axes as shown in the drawing, and is normal to the drawing sheet, hence three channels of signals can be taken out of the block. Consequently, the slit (or spot) is also provided three in number for each optical axis. For each channel, there is provided an optical system comprising component members 31 to 34 in front of the slit (or spot) 35. In this illustrated embodiment, however, the optical system of the channel X alone is shown, and the other optical systems are omitted, since they are same in construction. It is, of course, possible that light from the light source 31 is split by the beam splitter so that the light source to be used may be single.

Light scanned by the scanner passes through an image rotator 37 before it reaches a lens 39 (corresponding to the lens 22 in FIG. 3). Assume, for example, that the normal of the three mirror surfaces constituting the image rotator of the channel X is in the plane of the drawing sheet. The image rotator 37 of the channnnel (enclosed by dotted lines) is disposed at a position rotated by 45 degrees with an axis PP' as the rotational axis thereof, whereupon the light which has passed through the channel X is scanned within the plane of the drawing sheet at the points 41 and 42 on the surface of the object (wherein the numeral 41 refers to a mask and the numeral 42 refers to a wafer). On the other hand, however, the light which has passed through the channel Y is scanned in the direction normal to the drawing sheet. That is, as shown in FIG. 6, light from the channel X and light from the channel Y move each other, as shown in the drawing, within the sight of the microscope with the consequence that the two-dimensional discrepancy between the objects 41 and 42 can be detected. When the member 35 is in the slit form, the direction of the slit should preferably be set in such a manner, that it may become perpendicular to the scanning direction. Incidentally, in FIG. 8, the image rotator of the channel X is inserted for the purpose of correcting the light path length. Going back again to FIG. 5, a reference numeral 38 designates a beam splitter, and a numeral 39 refers to a relay lens, the construction of both being as shown in FIG. 3. A numeral 40 refers to the telecentric objective lens, 41 indicates a mask, and 42 denotes a wafer. The photo-electric detection system consists of members 43, 44, 45 and 46, in which 43 refers to an image forming lens of the pupil, 44 indicates a stopper, 45 denotes a light converging lens, and 46 represents a photo-detector. The entire construction in the neighborhood of this photo-electric detection system is the same as explained in FIG. 3, hence explanations are dispensed with. Incidentally, the beam splitter 38 may be inserted on the way of the channel X and arrange the same at the left side so that the left side part may also be scanned as shown by a dotted line in FIG. 5.

Figure 7:
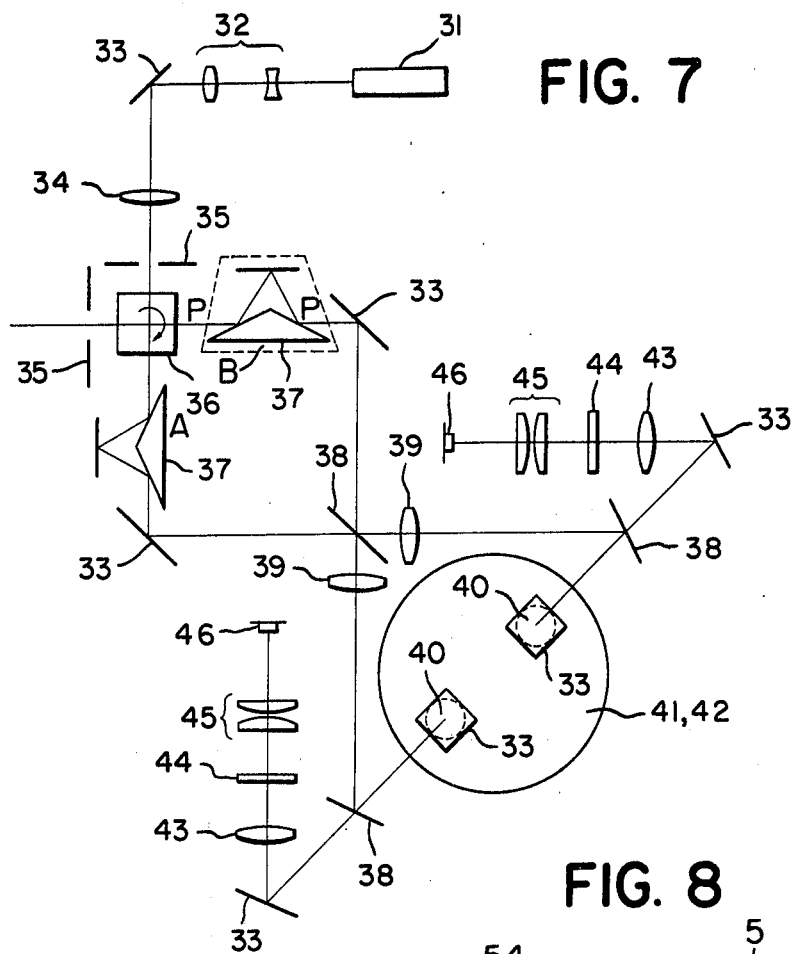
FIG. 7 is a schematic diagram showing an optical layout of a third embodiment of the present invention.

FIG. 7 illustrates another layout of the optical system same as that shown in FIG. 5. In this embodiment, the optical axis of the objective lens is normal to the drawing sheet so as to be able to observe the mask 41 and the wafer 42 positioned within a plane parallel with the drawing sheet. With this optical system, the number of the image rotator 37 to be used can be two. Essentially, a single image rotator will, of course, suffice the intended purpose, but, for correction of the light path length, two image rotators are used in this embodiment. The function of the optical system is exactly same as that shown in FIG. 5, hence the explanation thereof is dispensed with.

In FIGS. 5 and 7, the optical system for observation with eyes, and the light source for observation to be provided, if need be, are not illustrated. Since their provision can be easily realized either by inserting the beam splitter in one part of the light path, or by changing the mirror to the beam splitter, they are omitted from showing. Further, the constructions shown in FIGS. 5 and 7 make it essential that the image rotator be present. However, by improving the alignment mark on the mask and wafer in some way or other, the discrepancies in both X and Y directions can be detected at once with a unidirectional scanning. In such case, since the scanning operation can be performed in a single direction, there is no necessity of inserting the image rotator, or of introducing a beam in two channels with respect to each viewing position.

Figure 8:
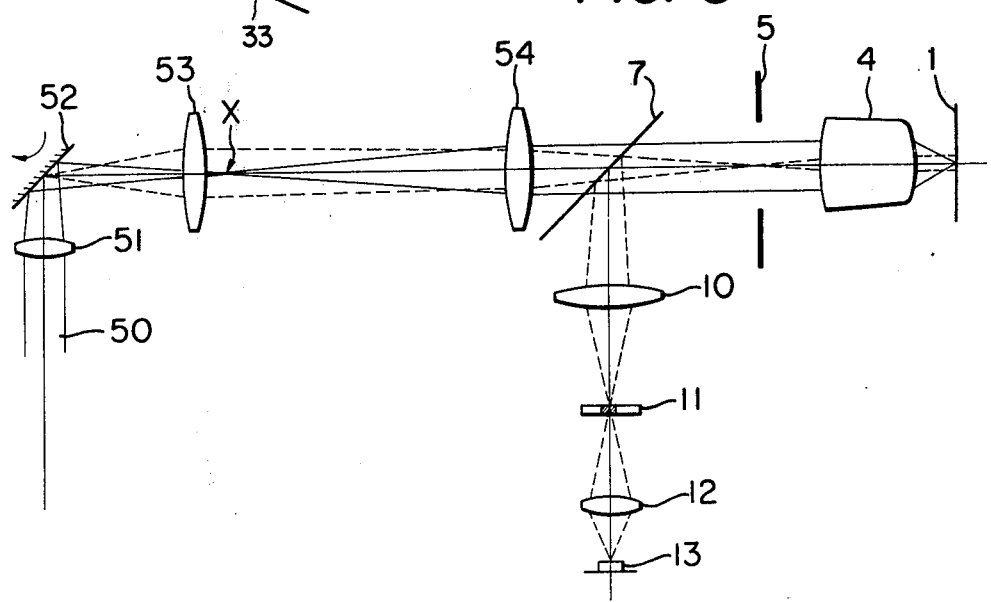
FIG. 8 is a schematic diagram showing an optical layout of a fourth embodiment of the present invention.

FIG. 8 shows a different embodiment of the optical system of a type, in which the scanning optical system causes the scanning beam to deflect with one point as the center of deflection, for example, an optical layout wherein the scanning device such as a rotatory polygonal mirror and a galvano mirror are used. A reference numeral 50 designates a laser beam, in the path of which a beam expander, or a converging or diverging lens may be inserted, if necessary. Such component member has been omitted from showing in this illustration for simplification of the explanations. A numeral 51 refers to a lens for converging the laser beam, and 52 refers to one surface of a rotatory polygonal mirror. A numeral 53 designates a field lens disposed in the vicinity of a converging point X of the beam due to the lens 51. The point X moves perpendicularly with respect to the optical axis by rotation of the polygonal mirror. Also, the size of the spot at the point X is determined by the F-number of the light beam to be fixed by the lens 51. A numeral 54 denotes a relay lens, and 4 refers to a telecentric object lens. A numeral 5 represents a pupil, and numeral 1 represents the object. In addition, the system composed of various members from the beam splitter 7 upto and including the light detector 13 is the same as that shown in FIG. 3, hence explanation is omitted. The characteristic in this system is that, when the principal light ray of the scanning beam is projected into the relay lens, it is no longer parallel. Accordingly, as has so far been indicated in FIGS. 3 to 7, the problem is not solved by merely locating the pupil of the telecentric object lens on the focal point of the relay lens, but a still different arrangement is required to be taken. In order that the beam may not almost move on the pupil surface, even when the scanning is conducted on the object surface, attention is given to the beam reflecting position which is an unmovable point on the rotatory polygonal mirror. That is, since the reflecting position of light projected onto the rotatory polygonal mirror fluctuates to so small a degree that it can be regarded as a substantially unmovable point, this point is focussed on the pupil position 5 of the objective lens by the use of the field lens 53 and the relay lens 54. In this way, the object surface can be scanned, while the beam position on the pupil surface is maintained unmovable. On the other hand, the plane to be scanned by the focussing point X of the beam due to the lens 51 is conjugate with the object surface 1. Consequently, the power of the lens 51 can be primarily determined from the size of the scanning spot for use in scanning the object surface (i.e., with what micron of the spot, the object surface is to be scanned), and the diameter of the incident laser beam. In general, since the diameter of the scanning spot is fairly larger than the diffraction limit of the objective lens, the diameter of the incident laser beam on the pupil plane is smaller than the diameter of the pupil of the objective lens with the result that the filtering method as shown in FIG. 3 and others becomes feasible.

Figure 9:
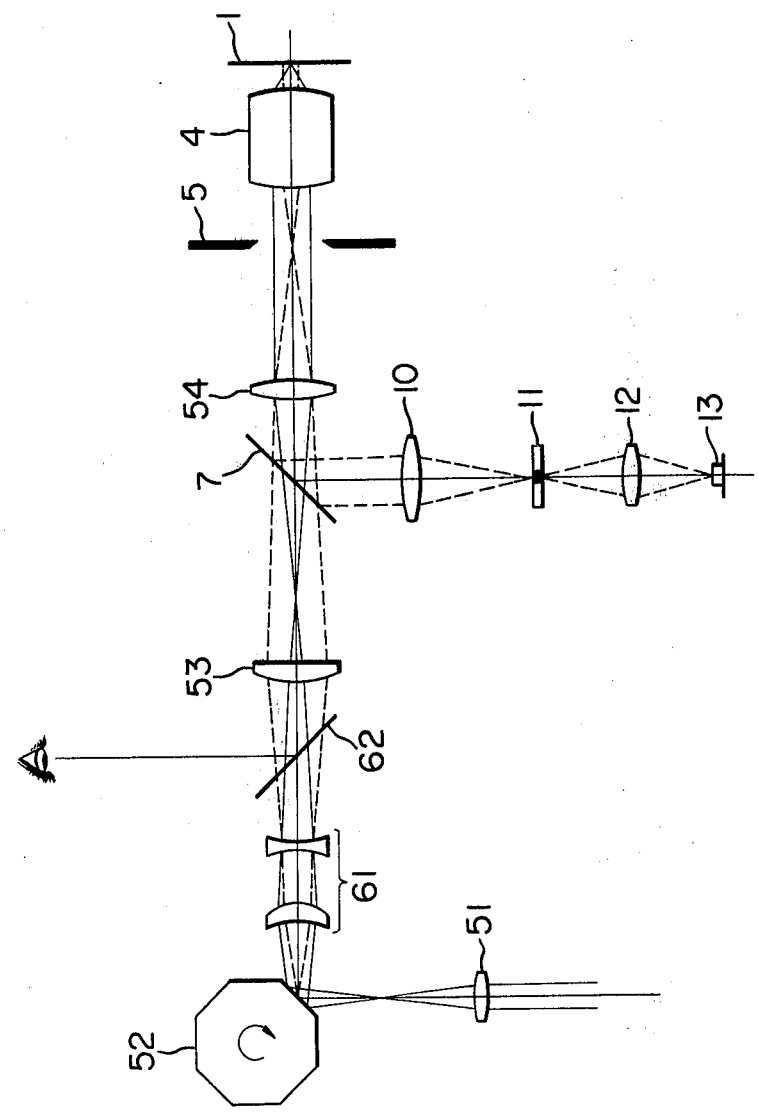
FIG. 9 is a schematic diagram showing an optical layout of a fifth embodiment of the present invention.

FIG. 9 shows an example embodying a system similar to that of FIG. 8 in another manner, using divergent light incident to 52, instead of convergent light. This system is similar to the FIG. 8 embodiment with the exception that a condensor lens 51 condenses the laser beam before the polygonal mirror, and the laser beam is once focussed through a lenses 61 and 53, and that the detecting optical system upto the photo-electric converter 13 is disposed between a relay lens 54 and a field lens 53. Designated by 62 is a half-mirror for a view finding optical system which is unshown. The feature of this embodiment is the existence of focussing lens 61 which provides the system as a whole with f-θ characteristics, that is, the compensation is made so as to provide linearly proportional relationship between the rotational speed of the polygonal mirror and the scanning speed over the scanning area. This is very important in view of ensuring linearity of the scanning operation. This applys also to the transparent type arrangement so that correction of linearity in the transparent type scanning is possible by the distortion property of the relay lens 22.

The following table shows data of the optical system of the embodiment shown in FIG. 9:

| Surface number | Radii of curvature of surfaces | Distance between lens surfaces | Refraction power | Notes |
| --- | --- | --- | --- | --- |
| 1 | ∞ | 30.0 mm | 1.0 | Reflecting surface of polygonal mirror |
| 2 | −463.57 mm | 4.0 | 1.76924 | f-θ lens system (61) |
| 3 | −42.494 | 0.5 | 1.0 | |
| 4 | 62.15 | 3.0 | 1.76924 | |
| 5 | −89.773 | 35.0 | 1.0 | |
| 6 | −16.77 | 3.0 | 1.51462 | |
| 7 | −35.227 | 10.0 | 1.0 | |
| 8 | ∞ | 20.0 | 1.51462 | Beam splitter (62) |
| 9 | ∞ | 5.0 | 1.0 | |
| 10 | 60.00 | 3.0 | 1.51462 | Field lens (53) |
| 11 | ∞ | 150.0 | 1. | |
| 12 | 80.67 | 1.27 | 1.60954 | Relay lens (54) |
| 13 | 42.948 | 1.67 | 1.51462 | |
| 14 | −732.25 | 85.36 | 1.0 | |
| 15 | 15.255 | 2.98 | 1.60102 | Objective lens (4) |
| 16 | 95.16 | 0.07 | 1.0 | |
| 17 | 12.19 | 4.48 | 1.64379 | |
| 18 | 7.154 | 4.53 | 1.0 | |
| 19 | −10.56 | 1.03 | 1.68444 | |
| 20 | 15.503 | 8.97 | 1.62074 | |
| 21 | −15.503 | 0.42 | 1.0 | |
| 22 | 24.949 | 3.91 | 1.64926 | |
| 23 | −49.547 | 18.206 | 1.0 | |
| 24 | ∞ | 1.5 | 1.51462 | Mask(0.06" thick) (1) |
| 25 | ∞ | | 1.0 | |

| | |
| --- | --- |
| Distance between object and reflective surface of polygonal mirror | 26.145 mm |
| F-number of scanning beam | 10 |
| Focal length of total system | −5.447mm |
| Scanning range | φ1.8 mm |

Although the above data are based on the embodiment shown in FIG. 9, they are more specific in that the f-θ lens system 61 consists of three lenses as defined by the data of surface numbers 2 through 7; the relay lens system 54 consists of two lenses as defined by the data of surface numbers 12 through 14 (the distance between the adjacent surfaces of the two lenses is zero); and the objective lens system 4 consists of 5 lenses as defined by the data of surface numbers 15 through 23 (the distance between the adjacent surfaces of the third and fourth lenses as counted from the relay lens system side is zero).

As stated in the foregoing, the scanning of the object surface with light beam and detection of the scanned light beam by the dark field method according to the present invention are more excellent than the conventional methods on all points such as light quantity, improvement in SN ratio, polarity of signal, and other problems, hence the present invention has wide varieties of application, not only in the automatic alignment device for IC, but also in other fields such as size measurement, curve tracking, and so forth.

What we claim is:

1. A device for scanning with a light beam an object having a flat reflection surface and an inclined reflection surface with a certain inclination relative to the flat reflection surface, comprising:
    (a) a deflector with the original point of deflection arranged to deflect the light beam from a light source, said deflector rotating at a constant angular velocity;
    (b) an objective lens arranged to receive the light beam from said deflector, said objective lens being so disposed that said original point of deflection is positioned on the center of the focal plane of said objective;
    (c) a light detector for detecting light which has been reflected at said object, and passed through said objective lens;
    (d) a filter interposed between said objective lens and said light detector, said filter functioning to intercept light from said flat reflection surface, and to cause light from said inclined reflection surface to pass therethrough; and
    (e) an optical element disposed between said deflector and said object, for converting the movement of the deflected light beam into a movement at a constant speed, over an area of the object to be scanned, which is proportional to said constant angular velocity.

2. A device for scanning with a light beam an object having a flat reflection surface and an inclined reflection surface with a certain inclination relative to the flat reflection surface, comprising:
    (a) a deflector with the original point of deflection arranged to deflect the light beam from a light source, said deflector rotating at a constant angular velocity;
    (b) an objective lens arranged to receive the light beam from said deflector, said objective lens being so disposed that said original point of deflection is imaged on the center of the focal plane of said objective lens by an intermediate optical system positioned between said deflector and said objective lens;
    (c) a light detector for detecting light which has been reflected at said object, and passed through said objective lens;
    (d) a filter interposed between said objective lens and said light detector, said filter functioning to intercept light from said flat reflection surface, and to cause light from said inclined reflection surface to pass therethrough; and
    (e) an optical element, disposed between said deflector and said object, for converting the movement of the deflected light beam into a movement at a constant speed, over an area of the object to be scanned, which is proportional to said constant angular velocity.

3. A device for photoelectrically positioning plural objects, each having an alignment mark which has a flat reflection surface and an inclined surface with a certain inclination with respect to the flat reflection surface, comprising:
    (a) a light source;
    (b) a deflector with the original point of deflection arranged to deflect the light beam from the light source, said deflector rotating at a constant angular velocity;
    (c) an objective lens arranged to receive the light beam from said deflector, said objective lens being so disposed that said original point of deflection is positioned on the center of the focal plane of said objective lens;
    (d) a light detector to detect light which has been reflected at said objects, and passed through said objective lens;
    (e) a filter interposed between said objective lens and said light detector, said filter functioning to intercept light from said flat reflection surface, and to cause light from said inclined reflection surface to pass therethrough;
    (f) an optical element disposed between said deflector and said objects, for converting the movement of the deflected light beam into a movement at a constant speed, over an area of the object to be scanned, which is proportional to said constant angular velocity; and
    (g) drive means to cause the relative position of said plural objects to change in accordance with signals obtained by said light detector.

* * * * *

UNITED STATES PATENT AND TRADEMARK OFFICE
CERTIFICATE OF CORRECTION

PATENT NO. : 4,165,149
DATED : August 21, 1979
INVENTOR(S) : AKIYOSHI SUZKI, ET AL It is certified that error appears in the above-identified patent and that said Letters Patent are hereby corrected as shown below:

Column 1, line 56, change "surface" to read --plane--.

Column 4, line 52, change "transmitting" to read --transmitted--;

Column 4, line 63, change "word" to read --words--.

Signed and Sealed this

Eleventh Day of December 1979

[SEAL]

Attest:

SIDNEY A. DIAMOND

Attesting Officer    Commissioner of Patents and Trademarks